United States Patent [19]
Kim et al.

[11] Patent Number: 5,986,475
[45] Date of Patent: Nov. 16, 1999

[54] APPARATUS AND METHOD FOR RESETTING A DYNAMIC LOGIC CIRCUIT

[75] Inventors: Song C. Kim, Santa Clara; Kuan-yu J. Lin, Mountain View, both of Calif.

[73] Assignee: Sun Microsystems, Inc., Palo Alto, Calif.

[21] Appl. No.: 08/883,195

[22] Filed: Jun. 26, 1997

[51] Int. Cl.$^6$ ....................... H03K 19/096; H03K 19/094
[52] U.S. Cl. .................................. 326/95; 326/98; 326/83
[58] Field of Search ................................ 326/93, 98, 121, 326/95, 96, 97, 83, 86; 327/142, 198

[56] References Cited

U.S. PATENT DOCUMENTS

| | | | |
|---|---|---|---|
| 5,550,490 | 8/1996 | Durham et al. | 326/98 |
| 5,818,264 | 10/1998 | Ciraula et al. | 326/98 |
| 5,828,243 | 10/1998 | Sprague | 326/98 |
| 5,831,452 | 11/1998 | Nowak et al. | 326/98 |
| 5,838,169 | 11/1998 | Schorn | 326/98 |

*Primary Examiner*—Michael Tokar
*Assistant Examiner*—Richard Roseen
*Attorney, Agent, or Firm*—Conley, Rose & Tayon, PC; B. Noel Kivlin

[57] ABSTRACT

An apparatus and method for resetting a dynamic logic circuit is disclosed. The apparatus includes an input circuit coupled to a plurality of input nodes wherein the input circuit comprises a plurality of FETs connected between a first voltage node and a dynamic node of a logic circuit. The gate electrode of each input circuit FET is connected to one of the input nodes. Precharged FET is connected between the dynamic node and a second voltage node. The precharge FET is configured to conduct a current for precharging the dynamic node to a predetermined voltage. An inverter is coupled between the dynamic node and an output node. A precharge control circuit is connected in a feedback path between the output node and the precharge FET. The precharge control signal activates the precharge control FET in response to a RESET pulse width and deactivates the precharge FET in response to the voltage on the dynamic node. As such, the precharge FET is controlled and the dynamic node is properly precharged independent of the RESET pulse width.

30 Claims, 4 Drawing Sheets

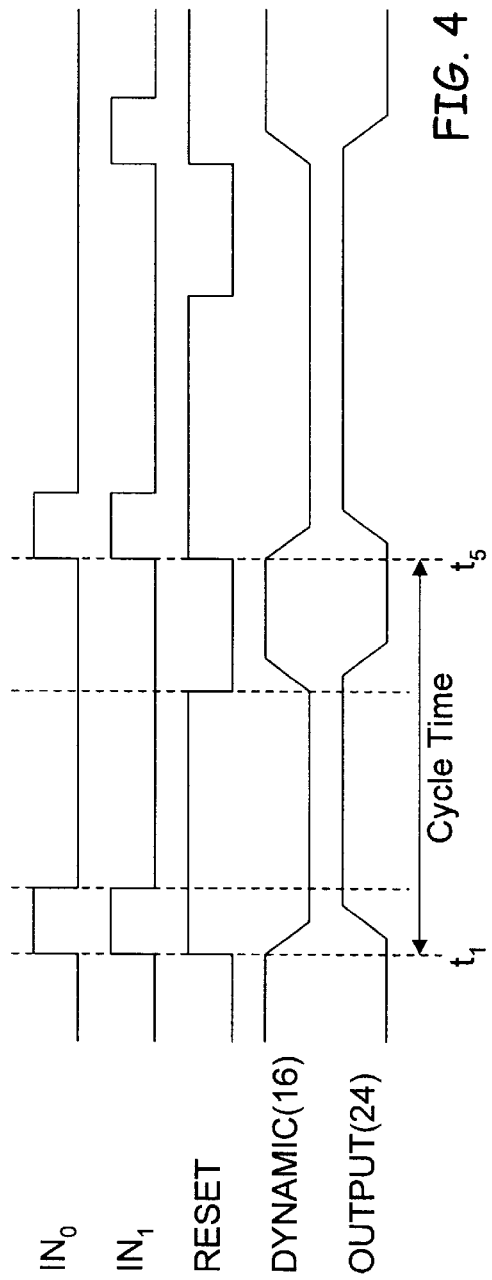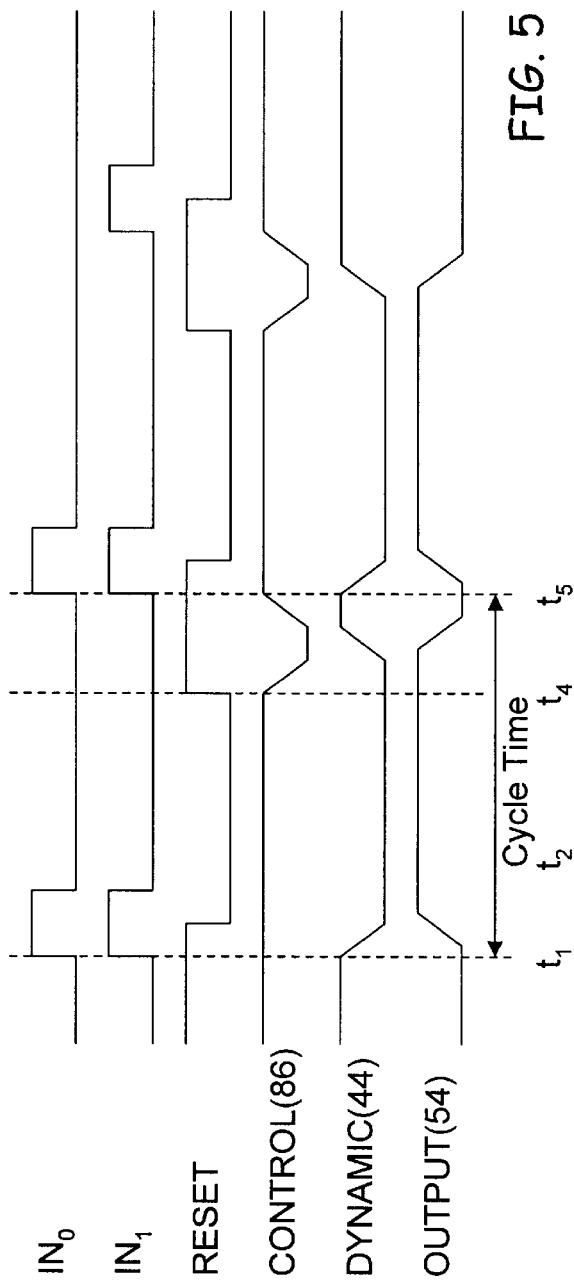

APPARATUS AND METHOD FOR RESETTING A DYNAMIC LOGIC CIRCUIT

BACKGROUND OF THE INVENTION

1. Field of the Invention

The present invention relates in general to logic circuits, and, in particular, to an apparatus and method for resetting dynamic nodes in dynamic logic circuits.

2. Description of the Relevant Art

Logic circuits are the building blocks of microprocessors and are used to perform instructions and mathematical operations. Any instruction and mathematical operation may be implemented using a combination of logic gates. CMOS is often the preferred technology to implement such logic circuits.

There are two generally recognized methods of logic circuit design: static and dynamic. Dynamic logic circuits generally include devices in which signals decay over a period of time unless regenerated. CMOS random access memories are examples of this type of device. In contrast, devices which operate with essentially constant electrical conditions are considered static.

Shown in FIG. 1 is an example of a dynamic logic circuit 10 for implementing a logical AND operation on input signals $IN_0$ and $IN_1$. Logic circuit 10 includes a pair of N-channel field effect transistors (N-FETs) 12 and 14 connected in series between dynamic node 16 and ground, P-channel FET (P-FET) 20 connected between supply voltage $V_{DD}$ and dynamic node 16, inverter 22 connected between dynamic node 16 and output node 24, P-FET 26 connected between supply voltage $V_{DD}$ and dynamic node 16 and, N-FET 30 connected between dynamic node 16 and ground.

The gate electrodes of N-FETs 12 and 14 are configured to receive digital input signals $IN_0$ and $IN_1$. The gate electrode of P-FET 20 is configured to receive input RESET signal.

With continuing reference of FIG. 1 and with further reference to FIG. 4, the operational aspects of logic circuit 10 will now be described. At time $t_1$, input signals $IN_0$ and $IN_1$ are asserted as high voltages (logical 1) thereby activating N-FETs 12 and 14. Presuming dynamic node 16 was previously charged to a predetermined high voltage, N-FETs 12 and 14 conduct current and discharge dynamic node 16 to a low voltage (logical 0). In response, inverter 22 generates at output node 24 a high voltage at time $t_2$. Thus, the high voltage at output node 24 represents the logical AND of the high voltages at $IN_0$ and $IN_1$. P-FET 26 and N-FET 30 have their gate electrodes coupled to output 24 and operate to latch the voltages at dynamic node 16 and output node 24.

At time $t_4$ RESET is asserted low thereby activating P-FET 20 to conduct current which recharges dynamic node 16 to its original predetermined high voltage. As shown in FIG. 4, RESET must be turned off at $t_5$ (deassert to logic high) before subsequent input signals $IN_0$ and $IN_1$ are provided to N-FETS 12 and 14 in order to avoid a possible fault condition whereby dynamic node 16 is connected to both supply voltage VDD and ground via P-FET 20 and the combination of N-FETs 12 and 14, respectively.

The time between $t_1$ and $t_5$ is often referred to as the cycle time in dynamic logic circuits. To increase the speed at which dynamic logic circuits operate, designers seek to reduce cycle time by reducing RESET time. There is a limit to the reduction of RESET since RESET must be made wide enough to ensure dynamic node 16 is precharged properly under all scenarios which take into account the process skew, RESET slew rate, RESET collision current etc. Extensive analysis must be employed to determine the precise RESET pulse to be provided to dynamic logic circuits in order to satisfy, as much as possible, all competing factors. Typically, marginal time is added to the width of RESET to ensure the dynamic node is properly precharged. Calculating and implementing precise pulses to dynamic circuits such as RESET, is known to be difficult and costly in modern logic circuit design.

SUMMARY OF THE INVENTION

The present invention addresses the problems of the prior art mentioned above and others, and provides an apparatus and method that utilizes a RESET pulse and a feedback path for resetting a dynamic node of a logic circuit. One embodiment of a logic circuit in which the present invention is employed includes an input circuit coupled to a plurality of input nodes, the input circuit comprising a plurality of FETs coupled between a first voltage and a dynamic node, wherein a gate electrode of each input circuit FET is coupled to an input signal node. A precharge FET is coupled between the dynamic node and a second voltage, wherein the precharge FET is configured to conduct current for precharging the dynamic node to a predetermined voltage. An inverter coupled between an output node and a dynamic node inverts the signal provided to the dynamic node. The logic circuit is configured to generate a signal which is a logical function of signals inputted to the input nodes.

The precharge FET is controlled by a precharge control circuit placed in feedback between the output node and the precharge FET. This precharge control circuit is configured to receive a RESET pulse, and in response, generates a first signal that activates the precharge FET which charges the dynamic node to a predetermined voltage. The precharge control circuit is also configured to receive the voltage at the output node which, by virtue of the inverter, represents the inversion of the voltage at the dynamic node. The precharge control circuit generates a second signal that deactivates the precharge FET which terminates charging of the dynamic node. The second signal is generated by the precharge control circuit in response to the dynamic node achieving its predetermined voltage. Thus, the precharge FET is controlled as a function of the RESET signal and the voltage at the dynamic node.

One advantage of the present invention is that it may eliminate the need for a high precision RESET pulse to precharge dynamic logic circuits.

Another advantage of the present invention is that it increases the frequency at which dynamic logic circuits operate.

Yet another advantage of the present invention may be that the precharge FET is deactivated to discontinue charging the dynamic node when the predetermined precharged voltage has been achieved.

Yet another advantage of the present invention may be that it can be utilized in dynamic logic circuits which embody a wide variety of logical functions.

BRIEF DESCRIPTION OF THE DRAWINGS

A better understanding of the present invention can be obtained when the following detailed description of the preferred embodiment is considered in conjunction with the following diagrams in which:

FIG. 4 is a timing diagram illustrating the operation of the logic circuit shown in FIG. 1, and;

FIG. 5 is a timing diagram illustrating operation of the logic circuit shown in FIG. 2.

Figure 1:
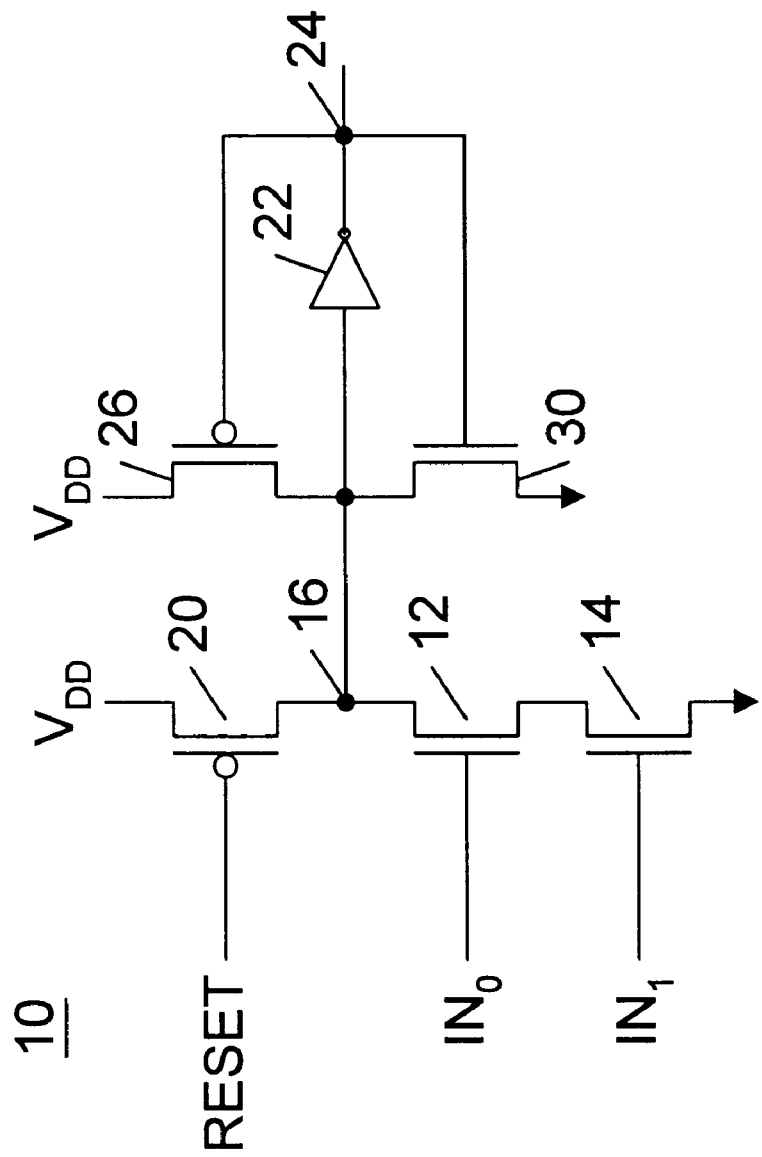
FIG. 1 is a circuit diagram representing a prior art dynamic logic circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the invention is to cover all modifications, equivalents, and alternatives falling within the spirit and scope of the present invention as defined by the appended claims.

DETAILED DESCRIPTION OF THE PREFERRED EMBODIMENTS

Figure 2:
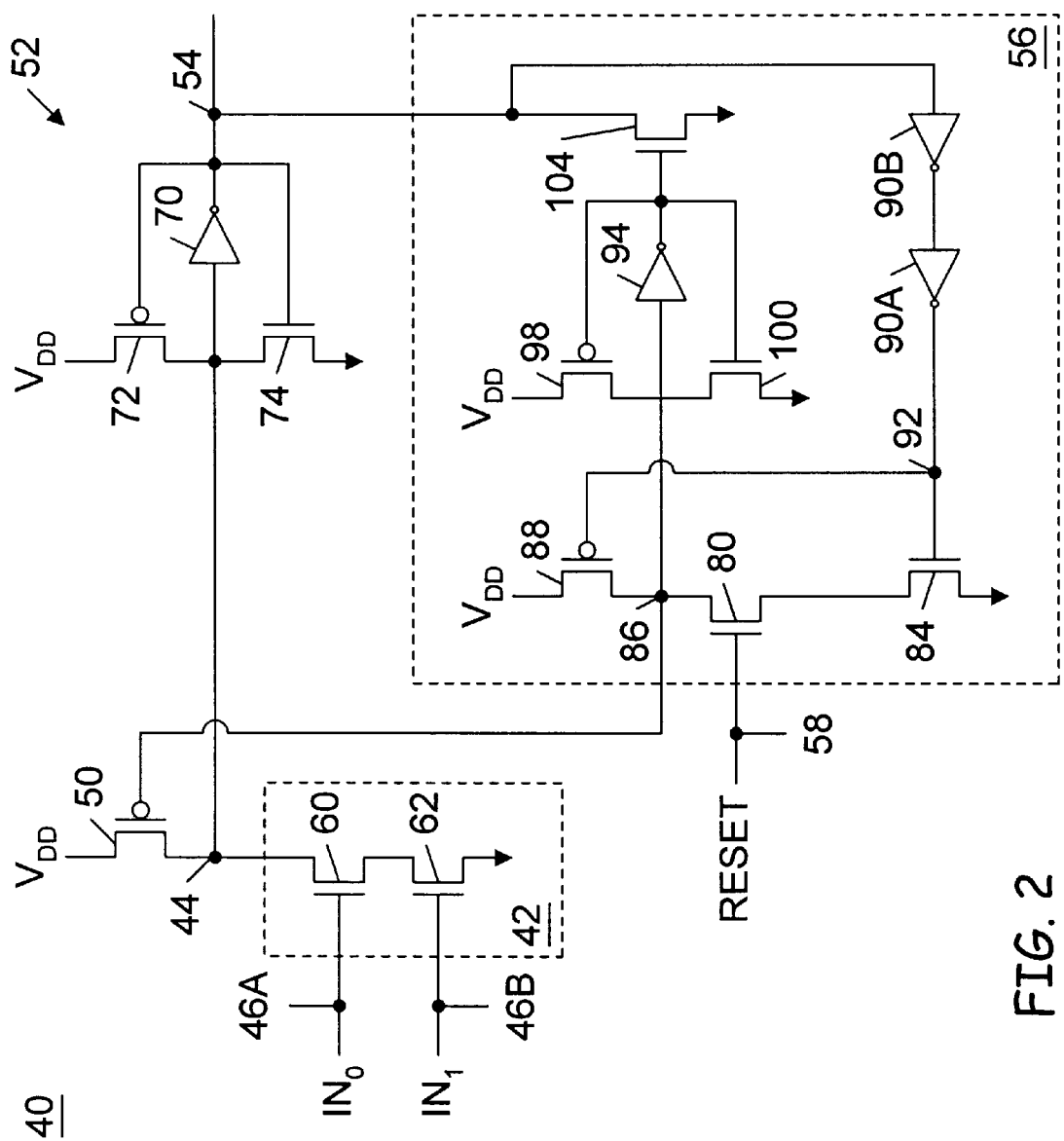
FIG. 2 is a circuit diagram representing a dynamic logic circuit employing the present invention.
Figure 3:
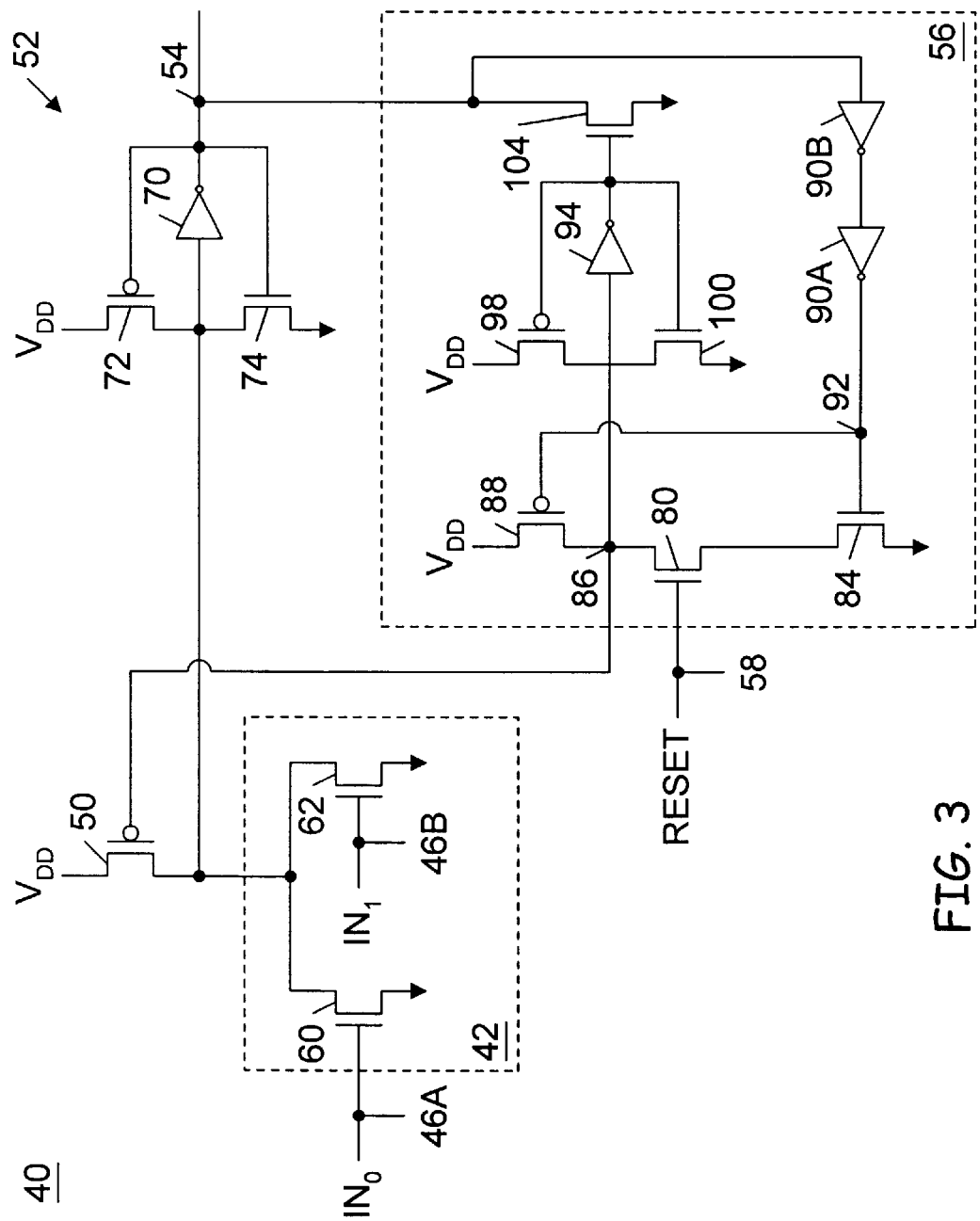
FIG. 3 is a circuit diagram representing a dynamic logic circuit employing the present invention.

With reference to FIGS. 2, 3, and 5, one embodiment of the present invention will now be described in greater detail. FIG. 2 shows a dynamic logic circuit 40 comprising an input circuit 42 coupled to dynamic node 44 and input digital signal nodes 46A and 46B, a precharge P-FET 50 coupled between dynamic node 44 and a voltage supply VDD, a latching circuit 52 coupled between an output node 54 and dynamic node 44, and a precharge control circuit 56 connected to output node 54, RESET node 58, and P-FET 50.

Input circuit 42 includes a pair of N-FETs 60 and 62 connected in series between dynamic node 44 and ground. Gate electrode of N-FET 60 is connected to digital signal input node 46A, while a gate electrode of N-FET 62 is connected to digital signal input node 46B. With N-FETs 60 and 62 connected in series as shown in FIG. 2, logic circuit 40, in combination with latching circuit 52, is configured to implement a logical AND of signals provided to input nodes 46A and 46B. Application of the present invention, however, should not be limited thereto. For example, FIG. 3 shows the logic circuit 40 of FIG. 2 with the N-FETs 60 and 62 connected in parallel to implement a logic OR function of signals provided to input nodes 46A and 46B.

Returning to FIG. 2, latching circuit 52 comprises an inverter 70 connected between dynamic node 44 and output node 54, P-FET 72 connected between supply voltage $V_{DD}$ and dynamic node 44, and N-FET 74 connected between dynamic node 44 and ground. Latching circuit 52 functions to maintain the voltage at node 44 and to convey inverted signal of node 44 to node 54 until changed via P-FET 50 or input circuit 42. N-FET 74 is small in size when compared to P-FET 72 and acts as a keeper of voltage on dynamic node 44.

Precharge control circuit 56 comprises N-FETs 80 and 84 connected in series between a control node 86 and ground, P-FET 88 connected between supply voltage $V_{DD}$ and control node 86, a pair of inverters 90A and 90B connected in series between output node 54 and a feedback node 92, inverter 94 connected between control node 86 and transistors 104, 98, and 100. P-FET 98 connected between supply voltage $V_{DD}$ and control node 86, N-FET 100 connected between control node 86 and ground, and N-FET 104 connected between output node 54 and ground. Precharge control circuit 56 provides a feedback path between output node 54 and P-FET 50. It is to be noted that precharge control circuit could be implemented with an inverter 90C (not shown) connected in series between inverter 90A and feedback node 92, wherein the input to inverter 90B would be directly coupled to dynamic node 44 instead of output node 54. Precharge control circuit 56 operates to control P-FET 50 as a function of the RESET signal provided to node 58 and the voltage on dynamic node 44.

As noted above, N-FETs 60 and 62 are connected in series within input circuit 42 to enable the logical AND function of circuit 40. Dynamic node 44 is presumed precharged to a high voltage before $IN_0$ and $IN_1$ are asserted. When $IN_0$ and $IN_1$ are asserted high, N-FETs 60 and 62 activate to conduct current for discharging dynamic node 44 to a low voltage substantially equal to ground. With a low voltage at dynamic node 44, inverter 70 of latch circuit 52 generates a high voltage at output node 54. Thus, when $IN_0$ and $IN_1$ are asserted high, logic circuit 40 generates a high voltage at output node 54. As expected, if either of the input signals $IN_0$ and $IN_1$ are asserted low, dynamic node 44 cannot discharge and the output of inverter 70 at node 54 will remain high. Circuit 40 thus provides a logical operation on input signals $IN_0$ and $IN_1$ in accordance with the following truth table:

| $IN_0$ | $IN_1$ | OUT |
|---|---|---|
| 0 | 0 | 0 |
| 0 | 1 | 0 |
| 1 | 0 | 0 |
| 1 | 1 | 1 |

Precharging of dynamic node 44 is provided by current conducted through P-FET 50. As can be clearly seen, it is important that P-FET 50 is deactivated whenever $IN_0$ and $IN_1$ arrive at input circuit 42. Otherwise, a substantial current drain could occur between power supply $V_{DD}$ and ground via P-FET 50, N-FET 60, and N-FET 62.

Latching circuit 52 latches the voltage on dynamic node 44 and provides an inverted output of the voltage on node 54. FETs 72 and 74 are often referred to as keepers in that they maintain or keep the voltages at dynamic node 44 and output node 54 until changed by the input circuit 42 or precharge P-FET 50.

As noted above, precharge control circuit 56 is in a feedback path between output node 54 and P-FET 50 in general and a gate electrode of P-FET 50 in particular. Precharge control circuit 56 generates signals which controls pre-charging of node 44 by the activation and deactivation of P-FET 50. Operation at the precharge control circuit 56 will be made with reference to FIG. 5 which shows a timing diagram with at least two cycles. Each cycle includes inputting digital signals $IN_0$ and $IN_1$ and resetting dynamic node 44. Initially, both inputs are set low and the dynamic node 44 remains high from a previous cycle. Thereafter at $t_1$, $IN_0$ and $IN_1$ are inputted, for example, as high signals which causes current to conduct through N-FET 60 and 62, which discharges dynamic node 44 to a low voltage. Latching circuit 52 inverts the low voltage on dynamic node 44 and produces a high voltage at output node 54 as seen at time $t_2$. The high voltage on output node 54 represents the logical "and" of input signals $IN_0$ and $IN_1$. The signal on node 54 can be inputted to further logic circuits (not shown) downstream. The high voltage at output node 54 also causes a high voltage at feed lack node 92 via inverters 90A and 90B which in turn activates N-FET 84.

At time $t_4$, the RESET pulse is inputted for the purpose of resetting the circuit in preparation to receive further input signals. This causes N-FET 80 to activate. When the RESET pulse is inputted, N-FET 82 is active by virtue of output node 54 being at a high voltage. As a result, control node 86 is discharged to a low voltage through N-FETs 80 and 84. Discharging control node 86 in turn activates P-FET 50 which in turn conducts current for charging dynamic node 44 to a high voltage or predetermined voltage which is substantially equal to power supply $V_{DD}$. In response, latching circuit 52 generates a low voltage at output node 54 which in turn, causes a low voltage at feedback node 92 via inverters 90A and 90B. Additionally, discharge of note 86 will charge node 102 which activates N-FET 104. N-FET 104 will discharge node 54.

A low voltage at node 92 has two effects. First, the low voltage at node 92 deactivates N-FET 84 which prevents a series connection between control node 86 and ground. Secondly, a low voltage at feedback node 92 activates P-FET 88 which conducts current for charging control node 86 to a high voltage at $t_5$ which in turn deactivates P-FET 50. With the dynamic node 44 precharged to a high voltage, logic circuit 40 is in proper condition for the next cycle which begins when $IN_0$ and $IN_1$ are reasserted.

It is important to note that P-FET 50 is controlled as a function of the RESET pulse and the voltage at node 44. Stated differently, P-FET 50 is turned on and conducts current for charging node 44 when RESET transitions from low to high, and is turned off by precharge control circuit when the voltage on node 44 is high. Using the present invention, the time for precharging dynamic node 44 is self-adjusting and there is no need to add margin to the RESET pulse width. Further, using the present invention, circuit frequency is increased. More particularly, as shown in FIG. 5, P-FET 50 deactivates via precharge circuit 56 well before reset pulse turns off. As such, the input signals can be inputted at an earlier time when compared to the prior art technique shown in FIG. 4. In so doing, the circuit frequency as measured between input to input, can be reduced.

N-FET 104 is connected between output node 54 and provides a discharge path to ground when activated. When control node 86 is driven low in response to the RESET pulse N-FET 104 is activated by inverter 94A. Providing the drain path between output node 54 and ground enhances the speed at which output node 54 is discharged in response to the precharging of dynamic node 44. P-FET 98 and N-FET 100 are connected to the control node 86 to maintain a voltage thereat until changed by the activation of P-FET 88 or the combination of N-FETs 80–84.

The foregoing description of the invention is illustrative and explanatory thereof, and various changes in the methods and apparatus may be made without departing from this invention as set forth in the following claims.

It is noted that there are other possible embodiments of a precharge control circuit for activating and deactivating precharge FET 50 as a function of or in response to the voltage on dynamic node 44, either directly or indirectly, and the reset pulse. The present invention should not be limited to the precharge control circuit shown in FIGS. 2 and 3. Moreover, other embodiments of an input circuit coupled to dynamic node 44 are possible which implement a wide variety of logical functions. Again, the present invention should not be limited to that shown in the attached figures.

What is claimed is:

1. A dynamic logic circuit for performing a logical operation comprising:

an input circuit configured to receive at least one input digital signal, the input circuit comprising at least one transistor coupled to a dynamic node, wherein the input circuit transistor is configured to selectively conduct current for charging the dynamic node to a first voltage;

a precharge transistor coupled to the dynamic node and configured to selectively conduct current for charging the dynamic node to a second voltage, and;

a precharge control circuit configured to receive a voltage indicative of a voltage on the dynamic node and a reset signal wherein the precharge control circuit is configured to control the precharge transistor in response to the reset signal and the voltage indicative of the voltage on the dynamic node.

2. The dynamic logic circuit of claim 1 wherein the input circuit comprises a plurality of transistors coupled between a dynamic node and a first voltage node.

3. The dynamic logic circuit of claim 2 wherein the input circuit comprises first and second N-FETs coupled in series between the dynamic node and the first voltage node.

4. The dynamic logic circuit of claim 1 wherein the precharge control circuit is configured to generate (1) a precharge transistor activation signal in response to receiving the reset signal, and (2) a precharge transistor deactivation signal in response to the dynamic node being charged to the second voltage.

5. The dynamic logic circuit of claim 4 wherein the precharge transistor is configured to (1) activate and begin conducting current to the dynamic node in response to the precharge transistor receiving the precharge transistor activation signal, and (2) deactivate and discontinue conducting current to the dynamic node in response to the precharge transistor receiving the precharge transistor deactivation signal.

6. The dynamic logic circuit of claim 5 wherein the precharge control circuit comprises:

a first transistor coupled between a second voltage node and a control node wherein the first transistor selectively conducts current to the control node in response to a voltage on a feedback node;

second, and third transistors coupled in series between the control mode and a first voltage node, wherein the second transistor is configured to selectively conduct current in response to the reset signal, and the third transistor is configured to selectively conduct current in response to the voltage on the feedback node;

wherein the control node is coupled to the precharge transistor;

wherein the feedback node is configured to be charged in response to the voltage indicative of the voltage on the dynamic node.

7. A dynamic logic circuit for performing a logical operation on a plurality of digital input signals, the dynamic logic circuit comprising:

a plurality of input nodes each configured to receive an input digital data signal;

a first voltage node configured to receive a first voltage;

a second voltage node configured to receive a second voltage;

a reset node configured to receive a reset digital signal;

an output node;

an input circuit coupled to the plurality of input nodes, the input circuit comprising a plurality of FETs coupled between the first voltage node and a dynamic node, wherein a gate electrode of each input circuit FET is coupled to one of the input nodes, and wherein the input circuit is configured to conduct current for charging the dynamic node to a first predetermined voltage;

a precharge FET coupled between the dynamic node and the second voltage node, wherein the precharge FET is configured to conduct current for charging the dynamic node to a second predetermined voltage, and;

a precharge control circuit having a first input coupled to receive a voltage indicative of a voltage on the dynamic node, a second input coupled to the reset node, and a control node coupled to a gate electrode of the pre-charge FET, wherein the pre-charge control circuit is configured to control the pre-charge FET in response to the reset digital signal and the voltage indicative of the voltage on the dynamic node.

8. The dynamic logic circuit of claim 7 further comprising a latching circuit having an input coupled to the dynamic node and an output coupled to the output node, wherein the first input of the precharge control circuit is coupled to the output node.

9. The dynamic logic circuit of claim 7 wherein the input circuit comprises first and second N-FETs coupled in series between the dynamic node and the first voltage node.

10. The dynamic logic circuit of claim 8 wherein the input circuit comprises a first N-FET and a second N-FET coupled between the first voltage node and the dynamic node, and wherein the precharge FET is defined by a first P-FET.

11. The dynamic logic circuit of claim 10 wherein the precharge control circuit comprises:

a second P-FET coupled between the second voltage node and the control node, wherein the second P-FET includes a gate electrode coupled to a feed back node;

third and fourth N-FETs coupled in series between the control node and the first voltage node, wherein a gate electrode of the third N-FET is coupled to the reset node, and a gate electrode of the fourth N-FET is coupled to the feed back node;

a first pair of inverters coupled in series between the first input and the feedback node, a second inverter coupled between the control node and an inversion node.

12. The dynamic logic circuit of claim 11 wherein the precharge control circuit further comprises a fifth N-FET coupled to the first input node and the first voltage node, wherein the fifth N-FET includes a gate electrode coupled to the inversion node.

13. The dynamic logic circuit of claim 12 wherein the precharge control circuit further comprises:

a sixth N-FET coupled between the control node and the first voltage node, wherein the seventh N-FET includes a gate electrode coupled to the inversion node;

a third P-FET coupled between the control node and the second voltage node, wherein the third P-FET includes a gate electrode coupled to the inversion node.

14. The dynamic logic circuit of claim 13 wherein the sixth N-FET and the third P-FET are configured to conduct less current than the second inverter.

15. The dynamic logic circuit of claim 14 further comprising:

a fourth P-FET coupled between the second voltage node and the dynamic node, wherein the fourth P-FET includes a gate electrode coupled to the output node;

a seventh N-FET coupled to between the first voltage node and the dynamic node, wherein the seventh N-FET includes a gate electrode coupled to the output node.

16. The dynamic logic circuit of claim 15 wherein the fourth P-FET and the seventh N-FET are configured to conduct less current than the first inverter.

17. The dynamic logic circuit of claim 7 wherein the precharge FET is configured to (1) activate and conduct current for charging the dynamic node in response to the reset node receiving a reset digital signal, and (2) deactivate when the dynamic node is charged to the second predetermined voltage.

18. The dynamic logic circuit of claim 7 wherein the precharge control circuit is configured to generate at the control node (1) a precharge FET activation signal in response to the second input receiving the reset digital signal, and (2) a precharge deactivation signal in response to the dynamic node being charged to the second predetermined voltage.

19. The dynamic logic circuit of claim 18 wherein the precharge FET is configured to activate and begin conducting current to the dynamic node in response to the precharge FET receiving the precharge activation signal, and deactivate and discontinue conducting current to the dynamic node in response to the precharge FET receiving the precharge deactivation signal.

20. The dynamic logic circuit of claim 7 wherein the first input is coupled to the dynamic node.

21. The dynamic logic circuit of claim 11:

wherein the third N-FET is configured to conduct current for charging the control node to a voltage substantially equal to the first voltage in response to the gate electrode of the third N-FET receiving the reset digital signal;

wherein the precharge FET is configured to conduct current for charging the dynamic node to the second predetermined voltage in response to the control node being charged by the second P-FET to the voltage substantially equal to the first voltage.

22. The dynamic logic control circuit of claim 21:

wherein the first inverter is configured to generate a current which charges the output node to a voltage substantially equal to the first voltage in response to the dynamic node being charged to the second predetermined voltage;

wherein the pair of inverters are configured to conduct current which charges the feed back node to a voltage substantially equal to the first voltage in response to the output node being charged to the voltage substantially equal to the first voltage;

wherein the second P-FET is configured to conduct current which charges the control node to the voltage which is substantially equal to the second voltage in response to the feedback node being charged to the voltage substantially equal to the first voltage;

wherein the precharge FET is configured to discontinue conducting current to the dynamic node in response to the control node being charged to the voltage substantially equal to the second voltage.

23. A logic circuit comprising:

plurality of input nodes each configured to receive an input digital data signal;

a first voltage node configured to receive a first voltage;

a second voltage node configured to receive a second voltage;

a reset node configure to receive a reset signal which is asserted for a first predetermined amount of time;

an output node;

an input circuit coupled to the plurality of input nodes, the input circuit comprising a plurality of FETs coupled between the first voltage node and a dynamic node, wherein a gate electrode of each input circuit FET is coupled to one of the input nodes;

a precharge FET coupled between the dynamic and the second voltage node, wherein the precharge FET is configured to conduct current, when activated, for precharging the dynamic node to a predetermined voltage;

a first inverter having an input coupled to the dynamic node and an output coupled to the output node, and;

a precharge control circuit having a first input coupled to receive a voltage indicative of a voltage on the dynamic node, a second input coupled to the reset node, and a control node coupled to a gate electrode of the precharge FET, wherein the precharge control circuit is configured to generate signals which activate and deactivate the precharge FET in response to the voltage on the dynamic node and the reset signal wherein the precharge FET is activated for a period of time which is substantially different than the second predetermined amount of time.

24. The logic circuit of claim 23 wherein the precharge control circuit comprises a P-FET coupled between the second voltage node and the control node, wherein the P-FET includes a gate electrode coupled to a feedback node;

first and second N-FETs coupled in a series between the control node and the first voltage node, wherein a gate electrode of the first N-FET is coupled to a reset node, and a gate electrode of second N-FET is coupled to the feedback node;

a second inverter coupled between the control node and an inversion node;

three inverters coupled in series between the first input and the feedback node.

25. The logic circuit of claim 23 wherein the precharge control circuit is configured to generate a precharge FET activation signal in response to the reset node being driven high by the reset signal, and a precharge FET deactivation signal wherein the precharge FET deactivation signal is generated independent of the first predetermined amount of time.

26. A dynamic logic circuit, comprising:

an input circuit including a plurality of transistors coupled between a dynamic node and a first power supply voltage, wherein each of the plurality of transistors is coupled to receive a different digital input signal and configured to selectively conduct current for charging the dynamic node to the first power supply voltage;

a precharge transistor coupled between the dynamic node and a second power supply voltage and coupled to receive a control signal at a control terminal, wherein the precharge transistor is configured to conduct current when the control signal is asserted; and a precharge control circuit coupled to receive a voltage indicative of a voltage on the dynamic node and a reset signal, and wherein the precharge control circuit is configured to: (i) assert the control signal in response to receiving the reset signal, and (ii) deassert the control signal when the voltage on the dynamic node is substantially equal to the second power supply voltage.

27. The dynamic logic circuit as recited in claim 26, wherein the dynamic logic circuit further comprises a latching circuit coupled between the dynamic node and an output node, and wherein the precharge control circuit receives the voltage indicative of the voltage on the dynamic node from the output node, and wherein the precharge control circuit produces the control signal at a control node.

28. The dynamic logic circuit as recited in claim 27, wherein the plurality of transistors comprises a plurality of N-FETs each having a gate electrode coupled to receive a different digital input signal, and wherein the precharge transistor is a P-FET having a gate electrode coupled to receive the control signal, and wherein the second power supply voltage is greater than the first power supply voltage.

29. The dynamic logic circuit as recited in claim 28, wherein the precharge control circuit comprises:

a P-FET coupled between the control node and the second power supply voltage and having a gate electrode coupled to the output terminal; and a first N-FET and a second N-FET coupled in series between the control node and the first power supply voltage, wherein the first N-FET has a gate electrode coupled to receive the reset signal, and wherein the second N-FET has a gate electrode coupled to the output terminal.

30. The dynamic logic circuit as recited in claim 29, wherein the precharge control circuit further comprises a third N-FET coupled between the output node and the first power supply voltage and having a gate electrode coupled to the control node through an inverter.

* * * * *